(12) United States Patent
Park et al.

(10) Patent No.: US 9,098,099 B2
(45) Date of Patent: Aug. 4, 2015

(54) DEVICE AND METHOD FOR INCREASING OUTPUT EFFICIENCY OF MOBILE COMMUNICATION TERMINAL

(75) Inventors: Bok-Ju Park, Suwon-si (KR);
Hyung-Sun Lim, Suwon-si (KR);
Hee-Sang Noh, Yongin-si (KR);
Jun-Seok Yang, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 121 days.

(21) Appl. No.: 13/883,675

(22) PCT Filed: Nov. 11, 2011

(86) PCT No.: PCT/KR2011/008634
§ 371 (c)(1),
(2), (4) Date: May 6, 2013

(87) PCT Pub. No.: WO2012/064155
PCT Pub. Date: May 18, 2012

(65) Prior Publication Data
US 2013/0229229 A1    Sep. 5, 2013

(30) Foreign Application Priority Data

Nov. 11, 2010   (KR) .................. 10-2010-0111896

(51) Int. Cl.
*H03G 3/20*      (2006.01)
*G05F 3/08*      (2006.01)
(Continued)

(52) U.S. Cl.
CPC ............... *G05F 3/08* (2013.01); *H03F 1/0227* (2013.01); *H03F 3/245* (2013.01); *H03G 3/004* (2013.01);
(Continued)

(58) Field of Classification Search
CPC ........................................................ H03F 1/00
USPC ................................................. 330/136, 127
See application file for complete search history.

(56) References Cited

U.S. PATENT DOCUMENTS 6,300,826 B1 * 10/2001  Mathe et al. .................... 330/10
8,301,088 B2    10/2012  Dunsmore et al.

FOREIGN PATENT DOCUMENTS

WO        2010089971 A1    8/2010

OTHER PUBLICATIONS

Dongsu Kim et al., High Efficiency and Wideband Envelope Tracking Power Amplifier with Sweet Spot Tracking, In: IEEE Radio Frequency Integrated Circuits Symposium, May 23-25, 2010, pp. 255-258.

(Continued)

*Primary Examiner* — Robert Pascal
*Assistant Examiner* — Khiem Nguyen
(74) *Attorney, Agent, or Firm* — Jefferson IP Law, LLP (57) ABSTRACT

An apparatus and a method for raising an output efficiency in a mobile communication terminal are provided. The apparatus includes a supply modulator and a power amplifier. The supply modulator includes a DC-DC converter, a voltage regulator, and a switching regulator. The supply modulator modulates an envelope component of an input signal to generate power. The power amplifier amplifies a phase component of the input signal using the power generated by the supply modulator as a power source of a collector/drain. The DC-DC converter raises battery power of the mobile communication terminal. The voltage regulator determines an output voltage of the supply modulator using the power raised by the DC-DC converter. The switching regulator determines an output current of the supply regulator using the battery power of the mobile communication terminal.

15 Claims, 7 Drawing Sheets

(51) Int. Cl.
*H03F 1/02* (2006.01)
*H03F 3/24* (2006.01)
*H04B 1/04* (2006.01)
*H03G 3/00* (2006.01)

(52) U.S. Cl.
CPC ........ *H04B 1/0483* (2013.01); *H03F 2200/324* (2013.01); *H03F 2200/451* (2013.01); *H04B 2001/045* (2013.01); *Y02B 60/50* (2013.01)

(56) References Cited

OTHER PUBLICATIONS

Jennifer Kitchen et al., Supply modulators for RF Polar Transmitters, In: IEEE Radio Frequency Integrated Circuits Symposium, Jun. 17, 2008-Apr. 17, 2008, pp. 417-420.

Jennifer N. Kitchen et al., Polar SiGe Class E and F Amplifiers Using Switch-Mode Supply Modulation, In: IEEE Transactions on Microwave Theory and Techniques, vol. 55, No. 5, May 2007, pp. 845-856.

\* cited by examiner

DEVICE AND METHOD FOR INCREASING OUTPUT EFFICIENCY OF MOBILE COMMUNICATION TERMINAL

BACKGROUND OF THE INVENTION

1. Field of the Invention

The present invention relates to a mobile communication terminal. More particularly, the present invention relates to an apparatus and a method for increasing an output efficiency of a mobile communication terminal.

2. Description of the Related Art

As a mobile communication technology evolves, a communication system processes a signal of a higher data rate gradually and requires a broadband transmission signal and a complicated modulation scheme. Accordingly, a transceiver of a mobile communication terminal should include a high efficiency, a broadband signal processing capability, and a linear amplify characteristic in order to process a broadband signal and a signal of a high Peak to Average Power Ratio (PAPR).

To accomplish the above characteristics, a mobile communication terminal uses a polar modulation power amplifier.

The polar modulation power amplifier separates the phase component and the envelope component of an input signal. After that, the phase component is up-converted to an RF carrier and provided as an input signal of the power amplifier. Also, the envelope component is modulated by a supply modulator and provided as a power source of a collector/drain of the power amplifier. Accordingly, the power amplifier amplifies the up-converted phase component provided via an input end using the modulated envelop component provided via the collector/drain to maintain a high efficiency and linearity of a high PAPR signal.

As described above, the power amplifier modulates the amplitude of an RF signal (AM modulation) using output power modulated by the supply modulator. Accordingly, the linearity of the supply modulator has a direct influence on the quality of a signal output via the power amplifier. Also, the efficiency of the entire system is determined by the product of the efficiency of the supply modulator and the efficiency of the power amplifier.

Figure 1:
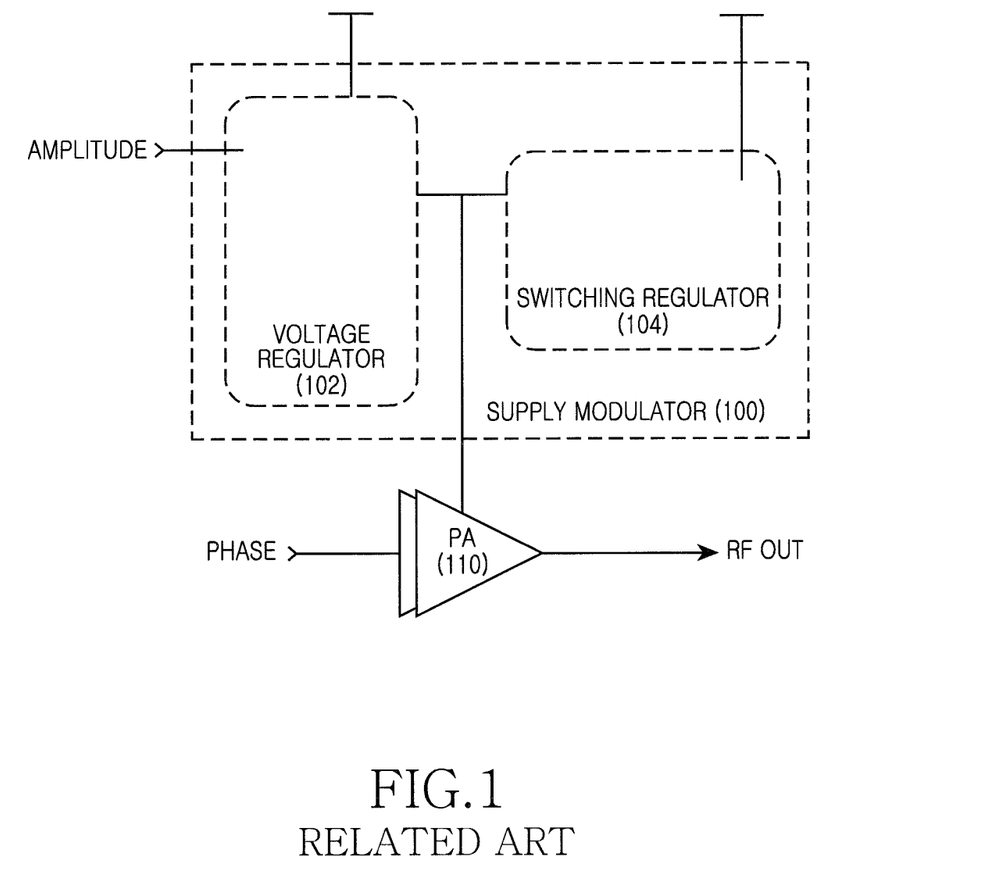
FIG. 1 is a view illustrating the configuration of the conventional supply modulator.

FIG. 1 illustrates the configuration of the conventional supply modulator.

As illustrated in FIG. 1, the supply modulator 100 has a hybrid form including a voltage regulator 102 and a switching regulator 104.

The voltage regulator 102 controls a voltage to be amplified in direct proportion to an input signal and output to determine an output voltage of the supply modulator 100.

The switching regulator 104 supplies an output current.

Generally, the voltage regulator 102 can linearly convert a signal in a wide band but has a low efficiency. The switching regulator 104 has a very high efficiency but cannot process a signal in a wide band. Accordingly, the supply modulator 100 determines the linearity of an output signal of the supply modulator 100 according to the high linearity of the voltage regulator 102, and determines the efficiency of the output power of the supply modulator 100 according to the high efficiency characteristic of the switching regulator 104.

However, since the battery capacity of a mobile communication terminal is limited, an output voltage of the supply modulator 100 determined by the voltage regulator 102 of the mobile communication terminal may be limited depending on an amount of the battery of the mobile communication terminal.

In the case where a battery voltage available at the voltage regulator 102 is limited, the quality of an output signal in a high power mode in which a transmitter consumes maximal power may deteriorate.

SUMMARY OF THE INVENTION

An aspect of the present invention is to address at least the above-mentioned problems and/or disadvantages and to provide at least the advantages described below. Accordingly, an aspect of the present invention is to provide an apparatus and a method for improving the quality of an output signal during a high power mode in a polar modulation power amplifier.

Another aspect of the present invention is to provide an apparatus and a method for improving the efficiency of output power during a high power mode in a polar modulation power amplifier.

Still another aspect of the present invention is to provide a supply modulator for improving the quality of an output signal during a high power mode in a polar modulation power amplifier, and an operating method thereof.

Yet another aspect of the present invention is to provide a supply modulator for improving the efficiency of output power during a high power mode in a polar modulation power amplifier, and an operating method thereof.

Further another aspect of the present invention is to provide an apparatus and a method for boosting an input voltage of a voltage regulator forming a supply modulator in order to raise an output efficiency and signal quality during a high power mode in a polar modulation power amplifier.

Further yet another aspect of the present invention is to provide an apparatus and a method for adaptively boosting an input voltage of a voltage regulator depending on an input amplitude level of the voltage regulator in a polar modulation power amplifier.

In accordance with an aspect of the present invention, an apparatus for amplifying power of a signal in a mobile communication terminal is provided. The apparatus includes a supply modulator for modulating an envelope component of an input signal to generate power, and a power amplifier for amplifying a phase component of the input signal using the power generated by the supply modulator as a power source of a collector/drain, wherein the supply modulator includes a DC-DC converter for raising battery power of the mobile communication terminal, a voltage regulator for determining an output voltage of the supply modulator using the power raised by the DC-DC converter, and a switching regulator for determining an output current of the supply modulator using the battery power of the mobile communication terminal.

In accordance with another aspect of the present invention, a method for generating an output voltage in a supply modulator including a switching regulator for generating an output current of a modulated power signal and a voltage regulator for generating an output voltage of the modulated power signal is provided. The method includes determining an amplitude level of a signal input to the voltage regulator, selecting one of at least two powers having different voltages, respectively, depending on a magnitude of the amplitude level, and generating an output voltage required by a power amplifier using the selected power.

Other aspects, advantages and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features and advantages of certain exemplary embodiments of the present invention will be more apparent from the following description taken in conjunction with the accompanying drawings in which.

Throughout the drawings, like reference numerals will be understood to refer to like parts, components and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

Exemplary embodiments of the present invention provide a technology for raising an output efficiency of an RF transmitter in a mobile communication terminal.

In the following description, it is assumed that a mobile communication terminal uses a polar modulation power amplifier.

In the case where an RF signal output from a transmitter of a mobile communication terminal has a high PAPR, the transmitter can raise not only signal quality but also the efficiency of a power amplifier when an envelope of an RF output has a high peak power envelope compared to an idle power envelope. That is, the amplitude component of an RF signal output from the transmitter should be raised to obtain an effect of increasing an effective output, so that the efficiency of the power amplifier can improve.

However, the peak power envelope is limited by a power voltage of the power amplifier. For example, in the case where the power of the mobile communication terminal has a value in the range of 4.2 V~3.4 V, the power amplifier of the mobile communication terminal cannot increase the peak power envelope due to a low power voltage. Accordingly, the mobile communication terminal can increase a feed power envelope by raising a battery voltage using a DC-DC converter in order to raise a high power voltage of the power amplifier.

Figure 2:
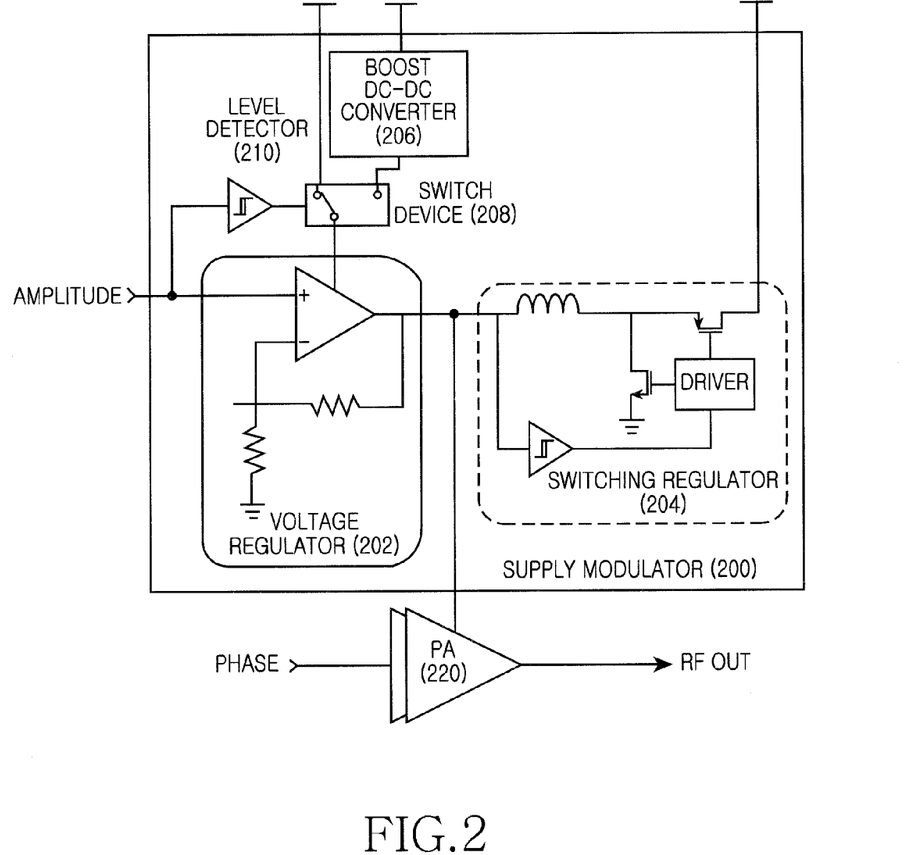
FIG. 2 is a view illustrating the configuration of a supply modulator according to the present invention.

In case of using the DC-DC converter, the supply modulator supplies power raised by the DC-DC converter to only a voltage regulator determining an output voltage of the supply modulator in order to reduce a loss by the loss of the DC-DC converter as illustrated in FIG. 2. That is, the supply modulator directly supplies battery power to a switching regulator determining most of an output current of the supply modulator. Therefore, the power amplifier can raise the peak of an output voltage to the battery voltage or more without deterioration of an output efficiency.

FIG. 2 illustrates the configuration of a supply modulator according to the present invention.

As illustrated in FIG. 2, the supply modulator 200 includes a voltage regulator 202, a switching regulator 204, and a DC-DC converter 206.

The DC-DC converter 206 raises the battery power of a mobile communication terminal to provide the same to the voltage regulator 202.

The voltage regulator 202 controls a voltage to be amplified in direct proportion to an input signal and output using power provided by the DC-DC converter 206 to determine an output voltage of the supply modulator 200.

The switching regulator 204 determines an output current of the supply modulator 200 using the battery power of the mobile communication terminal.

In the above embodiment, the voltage regulator 202 constantly uses the power raised by the DC-DC converter 206.

In another embodiment, the voltage regulator 202 may selectively use the power raised by the DC-DC converter 206 and the battery power of the mobile communication terminal depending on the level of an input amplitude. In this case, the supply modulator 200 further includes a switch device 208 for selecting power supplied to the voltage regulator 202 depending on the input amplitude level of the voltage regulator 202, and a level detector 210 for detecting the input amplitude level of the voltage regulator 202.

Figure 3A:
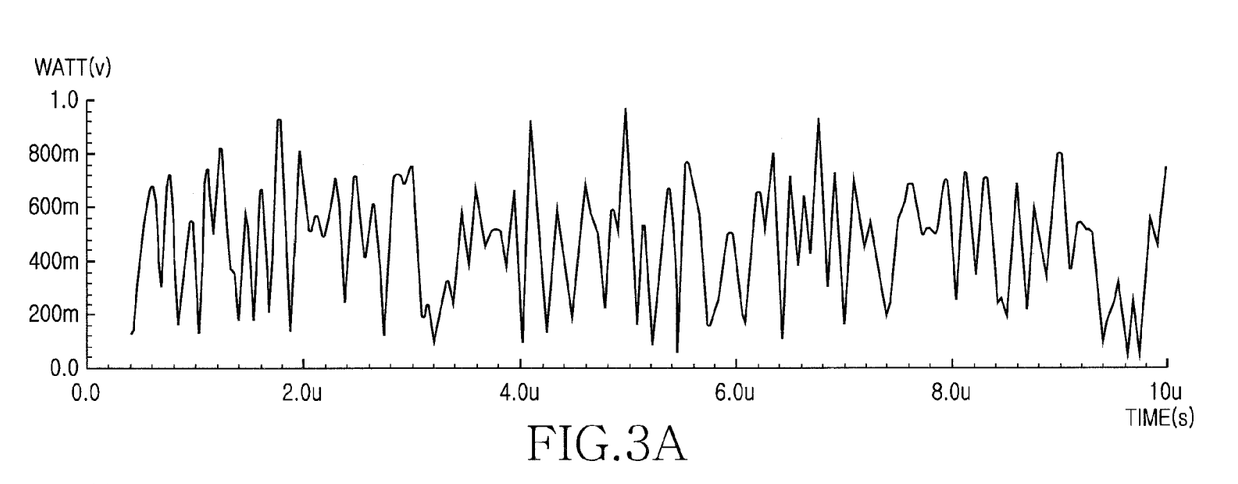
FIGS. 3A and 3B are graphs illustrating an envelope component of an RF output of a power amplifier according to various embodiments of the present invention.
Figure 3B:
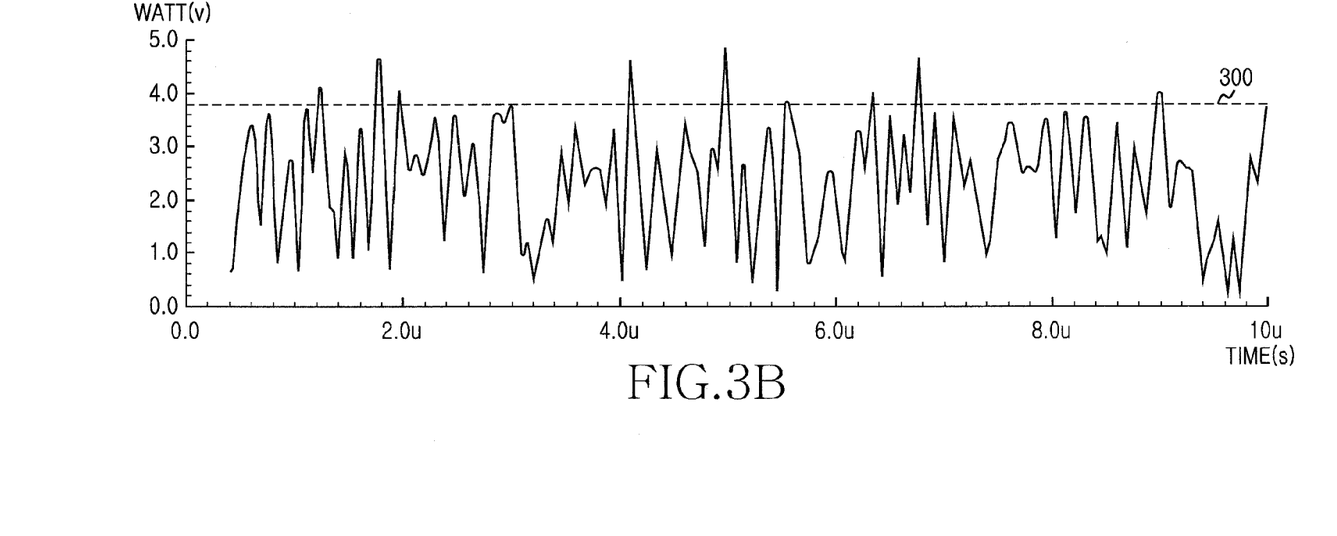
Figure 4:
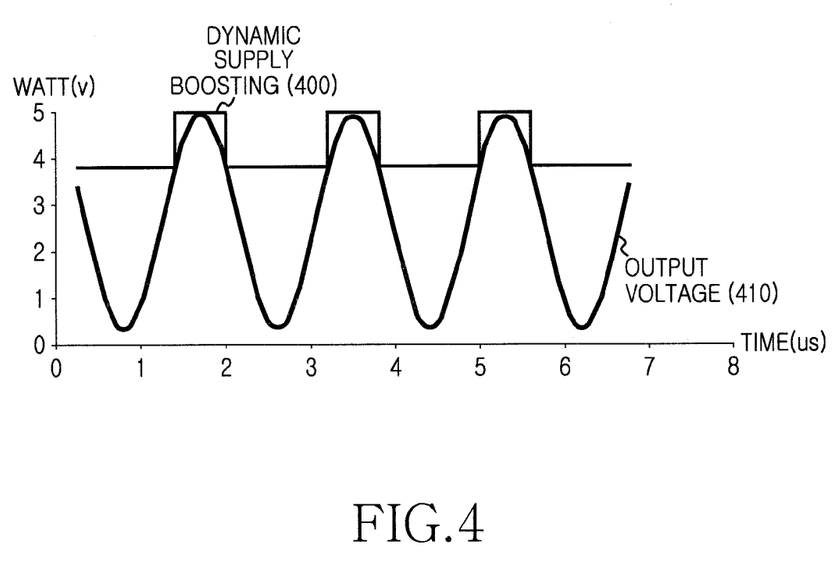
FIG. 4 is a graph for adaptively providing boost power according to an embodiment of the present invention.

For example, in the case where the power amplifier 220 amplifies a signal illustrated in FIG. 3A, an output envelope can be illustrated as in FIG. 3B. At this point, assuming the battery voltage of the mobile communication terminal is 3.8 V 300, a section exceeding the battery voltage of 3.8 V is less than 10% of an entire duty cycle in FIG. 3B. Therefore, as illustrated in FIG. 4, the voltage regulator 202 may use the battery power during a section where the envelope waveform 410 is less than 3.8 V in the entire duty cycle, and use power raised by the DC-DC converter 206 during the rest of the sections.

In the above embodiment, the voltage regulator 202 uses the battery power or the power raised by the DC-DC converter 206 with consideration of an output envelope of the power amplifier 220. Accordingly, as illustrated in FIG. 2, the level detector 210 and the switch device 208 determining power used by the voltage regulator 202 convert an input amplitude to an output envelope of the power amplifier 220 to determine power used by the voltage regulator 202.

In another embodiment, the level detector 210 and the switch device 208 may determine the power used by the voltage regulator 202 with consideration of a ratio of an output envelope and an input amplitude of the power amplifier 220.

As described above, in case of selectively determining the power used by the voltage regulator 202 depending on the level of an input amplitude, the mobile communication terminal may reduce a power loss by the DC-DC converter 206 by reducing a time used by the DC-DC converter 206.

Figure 5A:
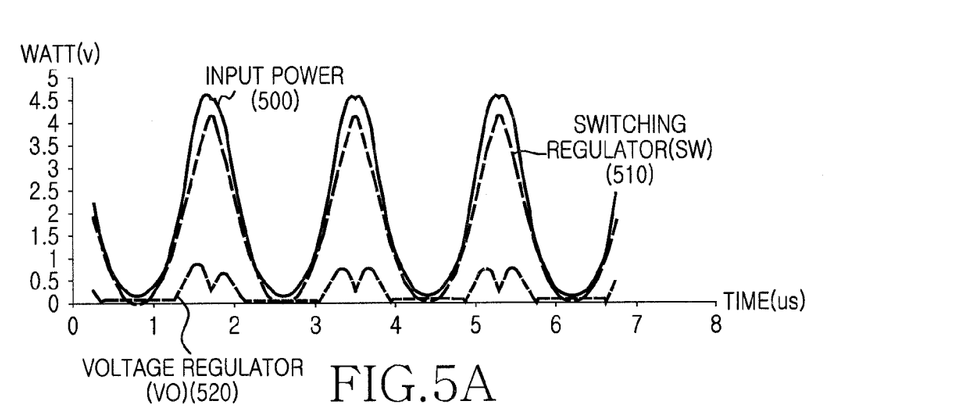
FIGS. 5A, 5B and 5C are graphs illustrating performance changes in case of adaptively providing boost power according to various embodiments of the present invention.
Figure 5B:
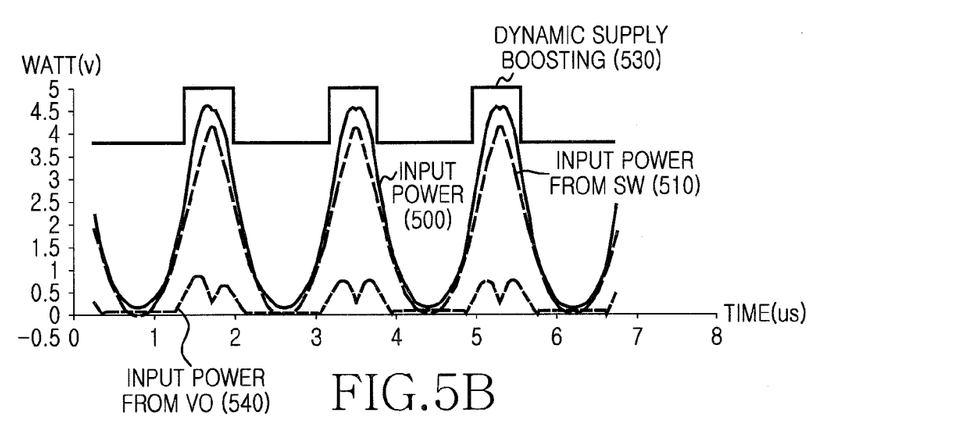
Figure 5C:
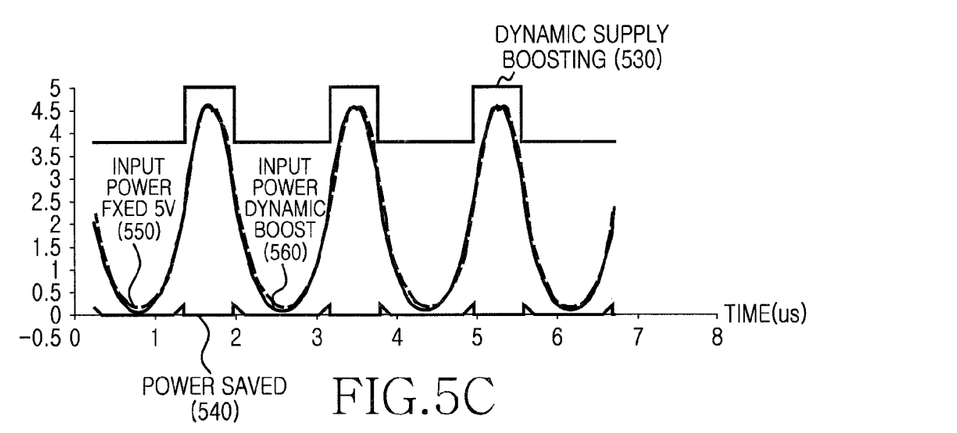
Figure 6A:
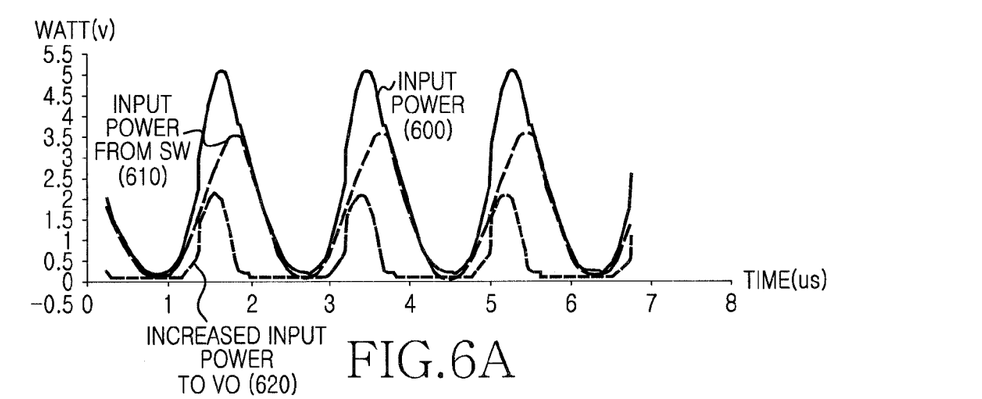
FIGS. 6A, 6B and 6C are graphs illustrating performance changes in case of adaptively providing boost power according to various embodiments of the present invention.
Figure 6B:
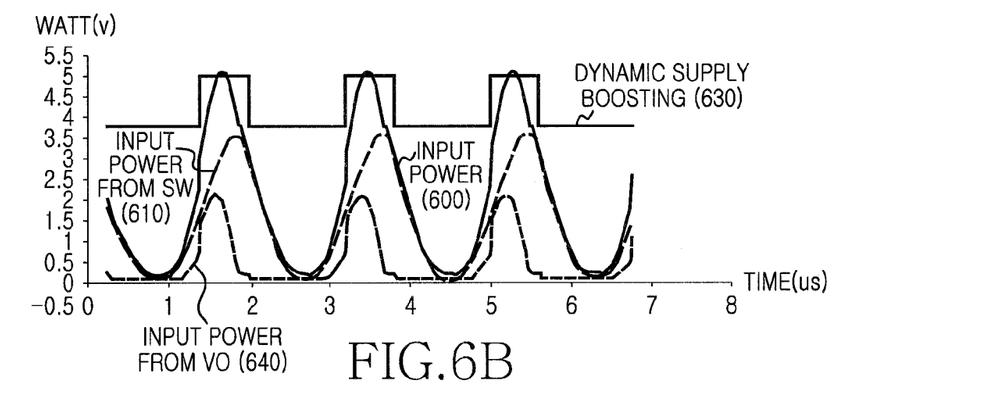
Figure 6C:
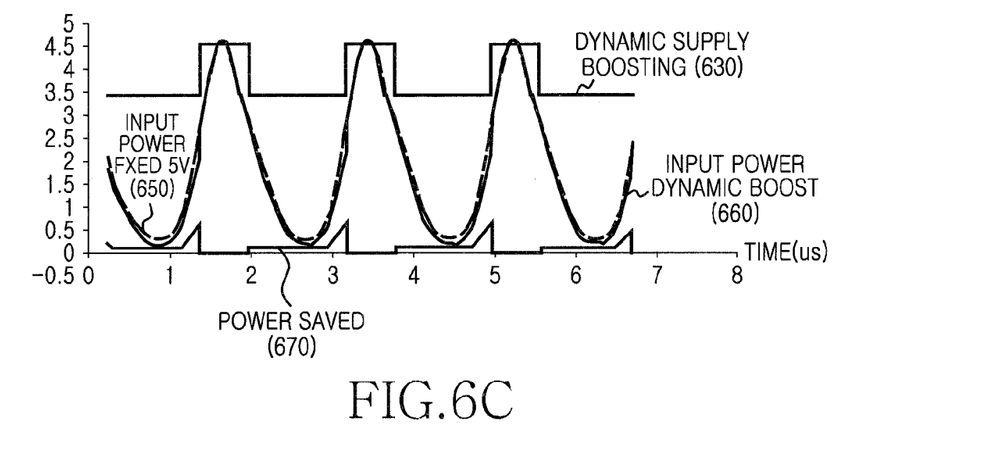

Also, as illustrated in FIGS. 5 and 6, the mobile communication terminal may reduce power consumption. The output current of the supply modulator is determined by a value obtained by dividing an output voltage determined by the voltage regulator by impedance of the power amplifier. Accordingly, the output current of the supply modulator has the same waveform as the output voltage in the form where it is linearly scaled to the output voltage determined by the voltage regulator.

However, the switching regulator determining the output current cannot have a slew rate for configuring the same waveform as the output voltage waveform having a high PAPR in a broadband. Accordingly, the output current that cannot be supplied by the switching regulator is supplied by the voltage regulator.

FIG. 5 illustrates performance change in case of adaptively providing boost power according to an embodiment of the present invention. In the following description, it is assumed that the switching regulator uses an inductor type switching DC-DC converter. At this point, it is assumed that the switching regulator raises a slew rate of a current by reducing the size of an inductor.

FIG. 5A illustrates a power waveform in the case where a voltage regulator constantly uses a boost power, FIG. 5B illustrates a power waveform in the case where a voltage regulator selectively uses a boost power depending on the level of an input amplitude, and FIG. 5C illustrates power consumed in FIGS. 5A and 5B.

As illustrated in FIG. 5A, in the case where input power 510 by a current supplied by the switching regulator cannot meet power 500 input from a supply regulator to a power amplifier, the voltage regulator additionally supplies (520) an insufficient current that cannot be provided by the switching regulator. At this point, the voltage regulator constantly uses the power raised by the DC-DC converter.

As illustrated in FIG. 5B, in the case where the input power 510 by a current supplied by the switching regulator cannot meet power 500 input from the supply regulator to the power amplifier, the voltage regulator additionally supplies (540) an insufficient current that cannot be provided by the switching regulator. At this point, the voltage regulator uses the power raised by the DC-DC converter during only a section where an input amplitude level is equal to or greater than a reference level as in an adaptive supply boosting curve 530. That is, the voltage regulator uses the battery power of the mobile communication terminal during a section where the input amplitude level is less than the reference level.

As illustrated in FIG. 5C, in case of selectively determining the power used by the voltage regulator depending on the level of an input amplitude (560, FIG. 5B), power consumption may be reduced compared to the case (550, FIG. 5A) where the voltage regulator constantly uses the power raised by the DC-DC converter (570).

FIG. 6 illustrates performance change in case of adaptively providing boost power according to another embodiment of the present invention. In the following description, it is assumed that the switching regulator uses an inductor type switching DC-DC converter. At this point, it is assumed that the switching regulator has an inductor whose size is long, so that a slew rate of a current is low.

FIG. 6A illustrates a power waveform in the case where a voltage regulator constantly uses a boost power, FIG. 6B illustrates a power waveform in the case where the voltage regulator selectively uses a boost power depending on the level of an input amplitude, and FIG. 6C illustrates power consumed in FIGS. 6A and 6B.

As illustrated in FIG. 6A, in the case where input power 610 by a current supplied by the switching regulator cannot meet power 600 input from a supply regulator to a power amplifier, the voltage regulator additionally supplies (620) an insufficient current that cannot be provided by the switching regulator. At this point, the voltage regulator constantly uses the power raised by the DC-DC converter.

As illustrated in FIG. 6B, in the case where input power 610 by a current supplied by the switching regulator cannot meet power 600 input from the supply regulator to the power amplifier, the voltage regulator additionally supplies (640) an insufficient current that cannot be provided by the switching regulator. At this point, the voltage regulator uses power raised by the DC-DC converter during only a section where an input amplitude level is equal to or greater than a reference level as in an adaptive supply boosting curve 630. That is, the voltage regulator uses the battery power of the mobile communication terminal during a section where the input amplitude level is less than the reference level.

As illustrated in FIG. 6C, in case of selectively determining the power used by the voltage regulator depending on the level of an input amplitude (660, FIG. 6B), power consumption may be reduced compared to the case (650, FIG. 6A) where the voltage regulator constantly uses the power raised by the DC-DC converter (670).

Figure 7:
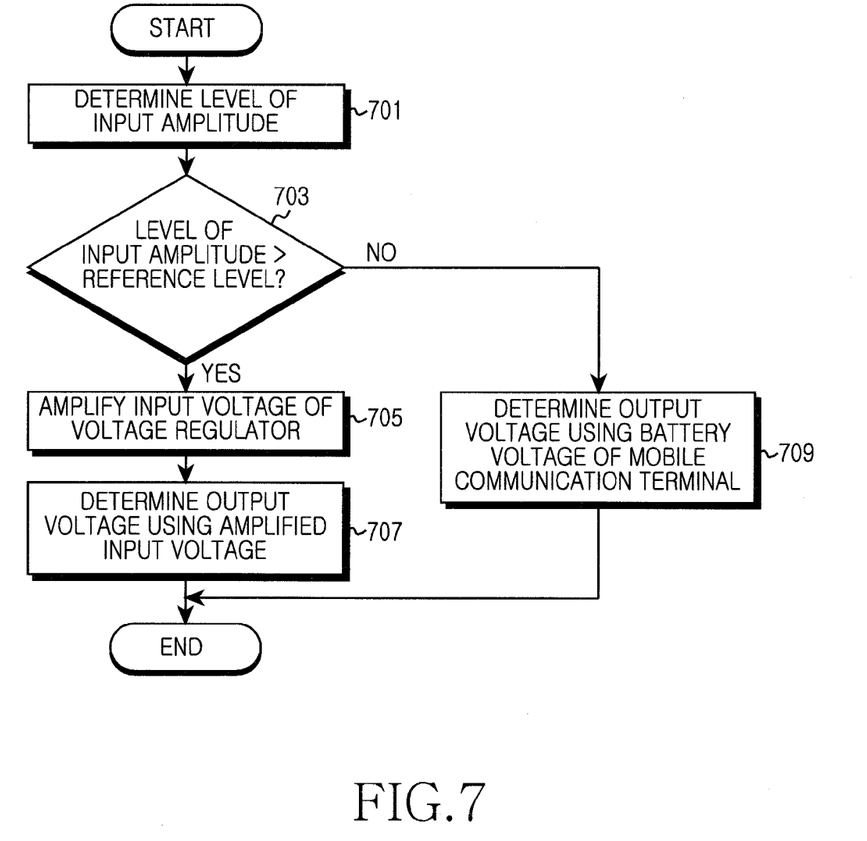
FIG. 7 is a flowchart illustrating a procedure for adaptively providing boost power according to an embodiment of the present invention.

FIG. 7 is a flowchart illustrating a procedure for adaptively providing boost power according to an embodiment of the present invention.

Referring to FIG. 7, the supply modulator determines an input amplitude level in step 701. For example, the supply modulator determines the amplitude level of a signal input to the supply modulator using the level detector 210 in FIG. 2.

After that, the supply modulator proceeds to step 703 to compare the input amplitude level with a reference level. For example, the supply modulator converts the input amplitude level determined in step 701 to an output envelope of the power amplifier 220 and compares the output envelope with the reference level. For another example, the supply modulator may compare the reference level determined with consideration of a ratio of the output envelope and the input amplitude of the power amplifier 220 with the input amplitude level determined in step 701.

When the input amplitude level is greater than the reference level, the supply modulator recognizes that it supplies a raised power to the voltage regulator. Accordingly, the supply modulator proceeds to step 705 to amplify the input power of the voltage regulator. For example, the supply modulator raises the battery power of the mobile communication terminal using the DC-DC converter 206 of FIG. 2.

After that, the supply modulator proceeds to step 707 to determine an output voltage using the power raised in step 705. For example, as illustrated in FIG. 2, the voltage regulator 202 of the supply modulator 200 determines an output voltage using the power raised by the DC-DC converter 206.

Meanwhile, when the input amplitude level is less than the reference level in step 703, the supply modulator recognizes that it supplies a not-raised power to the voltage regulator. Accordingly, the supply modulator proceeds to step 709 to determine an output voltage using the not-raised power. For example, as illustrated in FIG. 2, the voltage regulator 202 of the supply modulator 200 determines an output voltage using the battery power of the mobile communication terminal.

As described above, the polar modulation power amplifier boosts the input voltage of the voltage regulator forming the supply modulator, so that an output efficiency and signal quality during a high power mode can be raised.

Also, the input voltage is adaptively boosted depending on the input amplitude level of the voltage regulator, so that a power loss by a limited power voltage can be reduced.

Although the invention has been shown and described with reference to certain exemplary embodiments thereof, it will be understood by those skilled in the art that various changes in form and details may be made therein without departing from the spirit and scope of the invention as defined by the appended claims and their equivalents. Therefore, the scope of the present invention should not be limited to the above-described embodiments but should be determined by not only the appended claims but also the equivalents thereof.

What is claimed is:

1. An apparatus for amplifying power of a signal in a mobile communication terminal, the apparatus comprising:
   a supply modulator configured to modulate an envelope component of an input signal to generate power; and
   a power amplifier configured to amplify a phase component of the input signal using the power generated by the supply modulator as a power source of a collector/drain,
   wherein the supply modulator comprises:
      a DC-DC converter configured to raise a battery power of the mobile communication terminal and to output a raised battery power;
      a voltage regulator configured to determine an output voltage of the supply modulator using a selected one of the raised battery power output by the DC-DC converter and the battery power of the mobile communication terminal;
      a switching regulator configured to determine and output an output current of the supply modulator using the battery power of the mobile communication terminal; and
      a switch device configured to select the one of the raised battery power and the battery power depending on an amplitude level of a signal input to the voltage regulator.

2. The apparatus of claim 1, wherein the voltage regulator is further configured to generate a current for additionally supplying the current to an insufficient amount of the output current generated by the switching regulator.

3. The apparatus of claim 1, wherein the switching regulator comprises an inductor type switching DC-DC converter.

4. The apparatus of claim 1,
   wherein the supply modulator further comprises a level detector configured to determine the amplitude level of the signal input to the voltage regulator, and
   wherein the switch device is configured to select the one of the raised battery power and the battery power supplied to the voltage regulator depending on the amplitude level determined by the level detector.

5. The apparatus of claim 4, wherein the switch device is further configured to connect the battery power of the mobile communication terminal to the voltage regulator when the amplitude level determined by the level detector is less than a reference level, and to connect the raised battery power output by the DC-DC converter to the voltage regulator when the amplitude level determined by the level detector is equal to or greater than the reference level.

6. The apparatus of claim 5,
   wherein, when the amplitude level determined by the level detector is less than the reference level, the voltage regulator is further configured to determine the output voltage using the battery power of the mobile communication terminal depending on the switch device, and
   wherein, when the amplitude level determined by the level detector is equal to or greater than the reference level, the voltage regulator is further configured to determine the output voltage using the raised battery power output by the DC-DC converter depending on the switch device.

7. The apparatus of claim 1, wherein the DC-DC converter comprises a boost DC-DC converter.

8. A supply modulator comprising:
   a switching regulator configured to determine and generate an output current of the supply modulator; and
   a voltage regulator configured to determine an output voltage of the supply regulator according to a voltage magnitude of an input signal,
   wherein the voltage regulator is further configured to select one of at least two powers having different voltages depending on the voltage magnitude of the input signal of the voltage regulator to determine the output voltage of the supply modulator.

9. The supply modulator of claim 8, wherein the voltage regulator is further configured to generate a current for additionally supplying the current to an insufficient amount of the output current generated by the switching regulator.

10. The supply modulator of claim 8, further comprising:
    a DC-DC converter configured to raise a battery power of the supply modulator.

11. The supply modulator of claim 10, wherein the voltage regulator is further configured to:
    determine the output voltage using the battery power when an amplitude level of a signal input to the voltage regulator is less than a reference level; and
    determine the output voltage using a raised battery power raised by the DC-DC converter when the amplitude level of the signal input to the voltage regulator is equal to or greater than the reference level.

12. The supply modulator of claim 8, further comprising:
    a level detector configured to determine an amplitude level of a signal input to the voltage regulator, and
    a switch device configured to select power supplied to the voltage regulator depending on the amplitude level determined by the level detector.

13. The supply modulator of claim 12, wherein the switch device is further configured to connect a battery power to the voltage regulator when the amplitude level determined by the level detector is less than a reference level, and to connect a raised battery power obtained by raising the battery power to the voltage regulator when the amplitude level determined by the level detector is equal to or greater than the reference level.

14. A method for generating an output voltage in a supply modulator comprising a switching regulator and a voltage regulator, the method comprising:
    determining and generating, by the switching regulator, an output current of the supply modulator;
    determining an amplitude level of a signal input to the voltage regulator;
    selecting, by the voltage regulator, one of at least two powers having different voltages, respectively, depending on a voltage magnitude of the amplitude level to determine an output voltage of the supply regulator; and
    generating an output voltage required by a power amplifier using the selected power.

15. The method of claim 14, wherein the selecting of the at least one of the two powers comprises:
    when the amplitude level is equal to or greater than a reference level, selecting a battery power of the supply modulator; and when the amplitude is less than the reference level, selecting a raised battery power obtained by raising the battery power of the supply modulator.

\* \* \* \* \*